(12) United States Patent
Pohjonen

(10) Patent No.: US 6,462,950 B1
(45) Date of Patent: Oct. 8, 2002

(54) STACKED POWER AMPLIFIER MODULE

(75) Inventor: Helena Pohjonen, Espoo (FI)

(73) Assignee: Nokia Mobile Phones Ltd., Tampere (FI)

( * ) Notice: Subject to any disclaimer, the term of this patent is extended or adjusted under 35 U.S.C. 154(b) by 0 days.

(21) Appl. No.: 09/725,643

(22) Filed: Nov. 29, 2000

(51) Int. Cl.⁷ ............................................... H05K 7/20
(52) U.S. Cl. ..................... 361/704; 361/717; 361/718; 361/719; 361/761; 361/762; 361/763; 257/706; 257/712; 257/713
(58) Field of Search ................. 361/704, 705, 361/706, 707, 708, 712, 714, 715, 717–721, 749, 750, 751, 760–763, 767, 782, 783, 790; 257/675, 706, 707, 700; 174/252, 255, 260

(56) References Cited

U.S. PATENT DOCUMENTS

| | | | |
|---|---|---|---|
| 5,225,707 A | * 7/1993 | Komaru et al. | 257/513 |
| 5,578,796 A | * 11/1996 | Bhatt et al. | 361/764 |
| 5,796,165 A | * 8/1998 | Yoshikawa et al. | 257/728 |
| 5,892,657 A | * 4/1999 | Inoue | 361/704 |
| 6,037,665 A | * 3/2000 | Miyazaki | 257/773 |
| 6,335,669 B1 | * 1/2001 | Miyazaki et al. | 333/247 |
| 6,198,052 B1 | * 3/2001 | Omote et al. | 174/261 |
| 6,201,701 B1 | * 3/2001 | Linden et al. | 361/720 |
| 6,265,772 B1 | * 7/2001 | Yoshida | 257/712 |
| 6,301,114 B1 | * 10/2001 | Ootani | 361/704 |

OTHER PUBLICATIONS

"Passive Integration on SI for RF Circuits in Wireless Applications," by N. Pulsford, J. van Beek, M. van Delden, A. Boogaard and R. Milsom, from 1999 *IEEE MTT–S Digest*, THF5–7, May 1999, pp. 1897–1900.

"The Multilayer Ceramic Integrated Circuit (MCIC) Technology An Enabler for the Integration of Wireless Radio Functions," by D. Wilcox Sr., R.F. Huang and R. Kommrusch, from *Advancing Microelectronics*, Jul./Aug. 1999, pp. 13–18.

"High Mobility Poly–Si TFT's Fabricated on Flexible Stainless–Steel Substrates," by T. Serikawa and F. Omata, from *IEEE Electron Device Letters*, vol. 20, No. 11, Nov. 1999, pp. 574–576.

\* cited by examiner

*Primary Examiner*—Boris Chervinsky
(74) *Attorney, Agent, or Firm*—Ware, Fressola, Van Der Sluys & Adolphson, LLP

(57) ABSTRACT

Stacked substrates using passive integration components formed in silicon or stainless steel substrates interconnect with active elements mounted on the surface of the substrate to form a miniaturized power amplification module. Metal filled vias pass through the layers and carry electrical signals to and from the active elements and passive components. The metal filled vias function as thermal transfer heat sinks to transfer heat away from the active elements and the module.

6 Claims, 4 Drawing Sheets

STACKED POWER AMPLIFIER MODULE

TECHNICAL FIELD

The present invention relates generally to miniaturized power amplifiers and deals more particularly with a power amplifier module having passive components formed on a flexible silicon or stainless steel substrate using thin film passive integration and interconnected to active amplification components mounted on the substrate using metal filled via holes through the substrate to provide beat transfer and input and output terminals.

BACKGROUND OF THE INVENTION

Power amplifiers are one of the most power consuming components in portable wireless devices particularly portable cellular handsets due to cellular standard output power level requirements. There are a number of sources of power losses related to the power amplification function, for example the power efficiency of the 2-to-3 amplification stages typically required to produce the desired output power level; losses due to input and output impedance mismatching, and losses in the supply voltage stabilizing and control functions. Additionally, there are further losses caused by harmonic frequency suppression, such as for example, frequency filtering needed at input and/or output of the amplification stages. High volume manufacturing, faster system testing and design reuse requirements have led into the use of pre-tested power amplifier modules including functionality of more than one cellular standard. Low capacitance densities available from active silicon (Si) and galliumarsenide (GaAs) or indium (In) based integrated circuit technologies, and lossy passive components due to thin (typically 0.2–1.5 $\mu$m) metals and low resistive substrates used in silicon technology limit full monolithic integration of all supporting passive components together with the active elements (transistors, MOSFETs or MESFETs) needed for power amplification. Furthermore, full integration of all passive components used in a power amplifier may not be cost effective.

Currently, power amplifier modules are generally manufactured on laminate-like FR4 or BT laminate or ceramic (HTCC, high temperature co-fired ceramics or LTCC, low temperature co-fired ceramics) substrates to minimize various losses, and for cost optimization. Additional active and passive elements are mounted on top of these substrates. These prior art module substrates have limited capability for miniaturization because when using laminates, the required matching (capacitors and coils) and power stabilizing passive components such as, capacitors, ferrites and coils can be only partially embedded in the module substrates. In the case of laminated substrates such as FR4 and BT, the capacitance densities between different wiring layers are low (typically 0.05–0.5 pF/sq mm) which results in producing large (2–10 sq mm) area and inaccurate capacitors. Inductors or coils needed in typical matching circuits are a few nanohenries in value and their physical size is limited by the dielectric constant of the substrate material used which dielectric constant for a ceramic substrate is 6.5–9.5 and for a laminate substrate is 2.5–4.5. The interconnection metal thickness of the substrates and dielectric losses of the insulating layers also affect the total losses of the power amplifier module. Coils requiring magnetic material such as, ferrite core or isolator coils cannot be embedded in currently known power amplifier substrates.

FIG. 1 shows a prior art castellated power amplifier module 10 on layered substrates 12, 14 wherein all the power amplifier module components 16, 16 are surface mounted (SMT) components located on a surface 18 of the substrate 12 and includes one or more amplification stages. The size of the module 10 depends on the size of the SMT components; the numbers of substrate layers, wiring density and the type of substrate used which may be ceramic or laminate. Electrical input and output signals are fed to the module 10 components along castellated electrical conductors 20, 20 along the edges or sides of the module substrates. The amplifier module package is typically inserted into a socket mounted on a printed circuit board or the like forming the desired electrical circuit.

FIG. 2 shows another prior art land grid array (LGA) amplifier module 30 on layered substrates 32, 34 which may be ceramic or laminate, wherein some of the matching components 36, 38, 40 (resistor, inductor, capacitor) are embedded into the module substrate and some of the active devices required for the amplification stages or energy management circuits such as DC-to-DC converters may be flip chip 42 or wire bonded 44 on the surface 46 of the top substrate 34. Electrical input and output signals are fed to the module 30 components by means of metal posts or pins 48, 48 under the module which is inserted into a socket mounted on a printed circuit board or the like.

FIG. 3 shows another prior art ball grid array (BGA) module 60 on layered substrates 62, 63, 64 which may be ceramic or laminate, wherein some of the matching components 66, 68, 70 (resistor, inductor, capacitor) are embedded into the module substrate and some of the active components 72, 74 are flip chip or wire bonded on the substrate. Electrical input and output signals are fed to the module 60 components by means of an array of balls 76, 76 under the module which is inserted into a socket, soldered or otherwise connected to a circuit board or the like.

The demand for module miniaturization and increased heat transfer has led to solution attempts wherein some groups of supporting passive components are integrated as separate chips on a module substrate. FIGS. 4A and 4B show one side and an opposite side, respectively of a prior art example of a partial integration of a power amplifier module 80 wherein the main module substrate 82 is ceramic. A limited number of matching components 84, 86, 88 (resistor, inductor, capacitor) are passively integrated onto a high resistive silicon substrate 90 using thin film techniques to form an integrated passive chip 92. The chip 92 can be wire bonded or flip chipped on the module substrate 82 along with power amplifier chips 94, 94 and other SMT components 96, 96.

The use of hybrid assembly techniques such as illustrated in FIGS. 1–3 or the stacking of active and integrated passive substrates as illustrated in FIGS. 4A and 4B, together with SMT components lead to relatively thick modules (typically 1.2–2.2 mm). Additionally, heat generated in the active devices of the amplifier module must be conducted effectively out of the devices and the module. Typical power amplifier module substrates like glass fiber epoxies and $Al_2O_3$ have low thermal conductivity (~1 and 20 W/mK respectively) compared to metals (Cu 397 W/mK, Au 316 W/mK) or separate heat sink materials like AlN (190 W/mK), Be (250 W/mK) or silicon carbide (270 W/mK). One thermal transfer method uses metal posts that pass through the module substrate from the metallized backside of the amplifier chip to the system board to additional heat sinking metal plate(s). The use of additional heat sink materials increases the cost of the modules, and therefore is generally reserved for low volume and high power applications.

SUMMARY OF THE INVENTION

The present invention at least obviates if not entirely eliminates the disadvantages of prior art power amplification modules by providing a power amplification module with a silicon or stainless steel substrate having thin film passive integration formed passive components stacked on a substrate carrying active components.

In a broader aspect of the invention, a power amplification module comprises at least one thin film passive integrated substrate having formed therein one or more passive components and includes at least one active element for amplifying electrical signals. At least one active element is mounted on a thin film passive integrated substrate surface and the active element is interconnected to one or more passive components formed in the thin film passive integrated substrate thereby defining a power amplification electrical circuit configuration. Input/output electrical signals connect to and from the integrated passive components and active elements wherein the connecting means further comprises heat sinking means for transferring heat generated by an active element away from the active element and the module for dissipation.

It is an object of the present invention therefore to provide a miniaturized power amplification module for use in wireless and cellular communication applications that overcomes the problems associated with prior known power amplifier modules.

It is a further object of the present invention to provide a power amplification module having one or more thin substrate layers of silicon or stainless steel wherein passive integration components are formed therein and interconnect with active elements mounted thereon.

It is a still further object of the present invention to provide connection means through the amplification module substrate layers to carry input and output electrical signals to and from the passive integrated components and the active elements wherein the connection means provides thermal transfer from the active elements and the module.

It is a yet further object of the present invention to provide silicon or stainless steel substrates that are sufficiently thin to be flexible to accommodate packaging contours and shapes.

These and other objects and advantages of the present invention will become more apparent from an understanding of the following detailed description of presently preferred embodiments of the invention when considered in conjunction with the accompanying drawings.

DETAILED DESCRIPTION OF PREFERRED EMBODIMENTS

Figure 1:
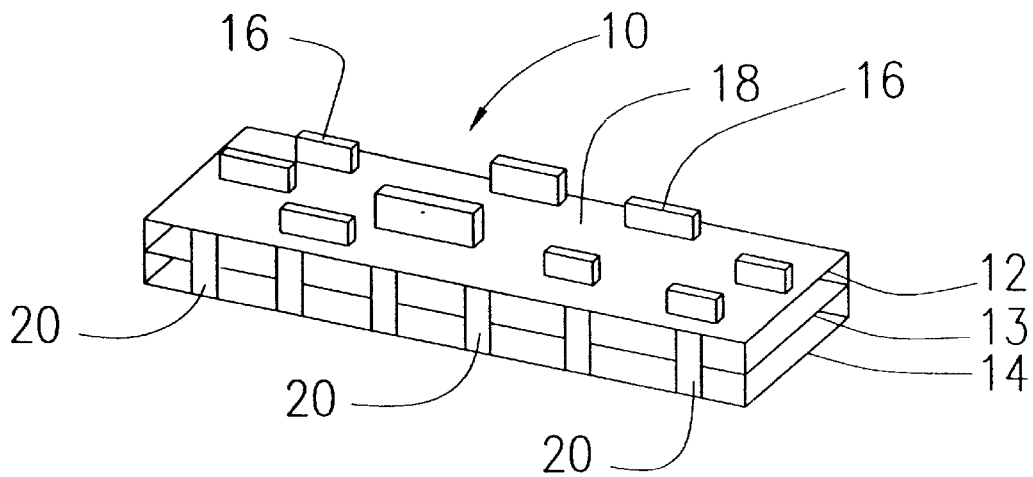
FIG. 1 is a diagrammatic representation of a prior art power amplifier module on substrates connected as a castellated module.
Figure 2:
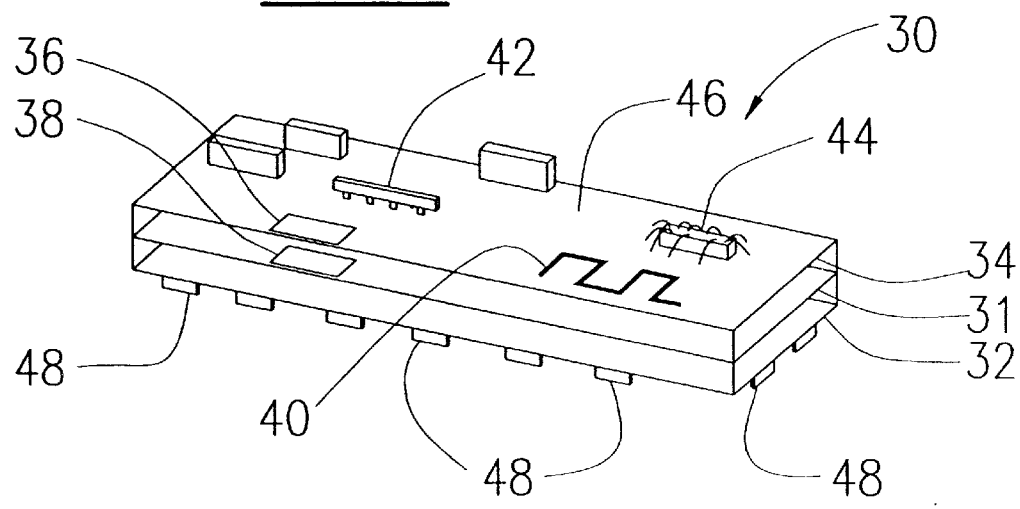
FIG. 2 is a diagrammatic representation of a prior art power amplifier module on substrates connected as a land grid array (LGA) module.
Figure 3:
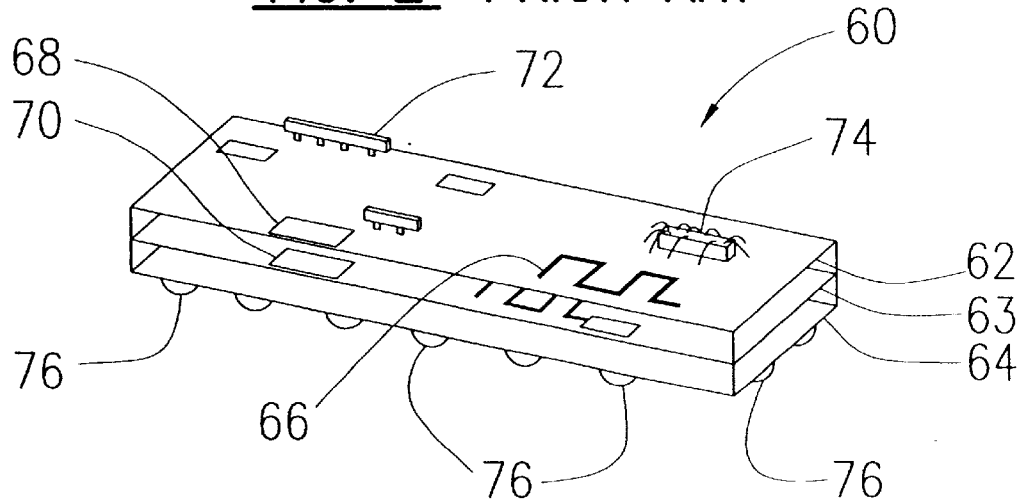
FIG. 3 is a diagrammatic representation of a prior art power amplifier module on substrates connected as a ball grid array (BGA) module.
Figure 4A:
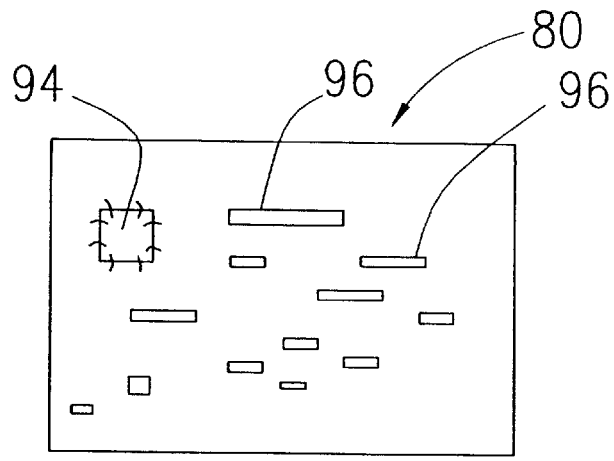
FIGS. 4A and 4B are diagrammatic representations of opposite sides respectively of a prior art power amplifier module partially integrated in accordance with prior art techniques.
Figure 4B:
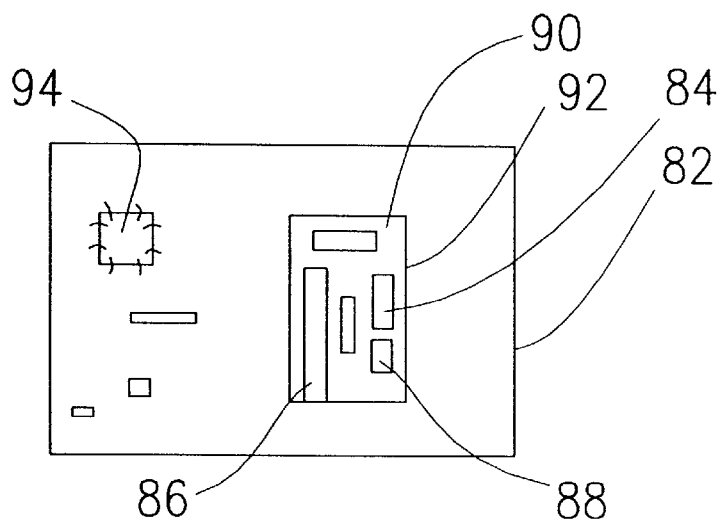
Figure 5:
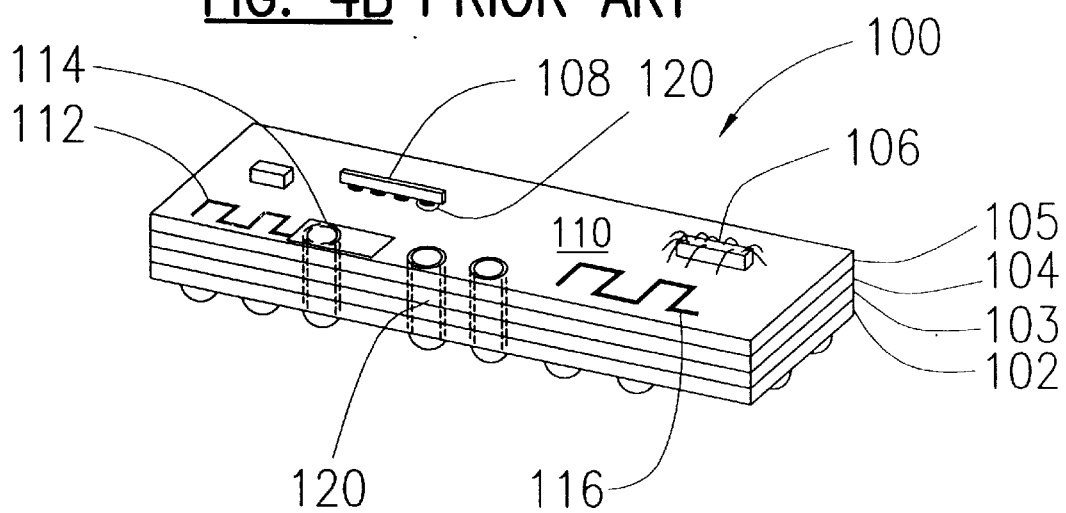
FIG. 5 is a diagrammatic representation of a stacked power amplifier module embodying the present invention.

Now considering the invention in further detail, a diagrammatic representation of a stacked power amplifier module embodying the present invention is illustrated in FIG. 5 and is generally designated 100. The module 100 is built on a thin film substrate such as silicon or stainless steel generally designated 102. A minimum number of dielectric layers and substrate layers 103, 104, 105 on which the required passive matching components (resistors, capacitors, inductors, microstrip/striplines) are integrated are stacked on the substrate 102 without the need of an additional module substrate to carry the passive integrated components. A dielectric coating on layers 103, 104, 105 isolate the integrated passive components from the substrate 102. Active devices such as a power amplifier chip 106 or other circuit function devices 108 connect to the surface 110 of the layer 105 of the module by wire bond or flip chip connection means. The passive integrated matching components for example, 112, 114, 116 are formed on the substrate layers. Although any insulating substrate-like glass can be used for passive integration of the matching passive components, silicon has good thermal conductivity (145 W/mK) compared to GaAs (46 W/mK), and preferably, silicon is used as the substrate for the thin film passive component integration. If a silicon substrate is used, additional active device functions such as for example, ESD (electrostatic discharge) and PIN diodes and varactors may be embedded in the silicon substrate.

Figure 6:
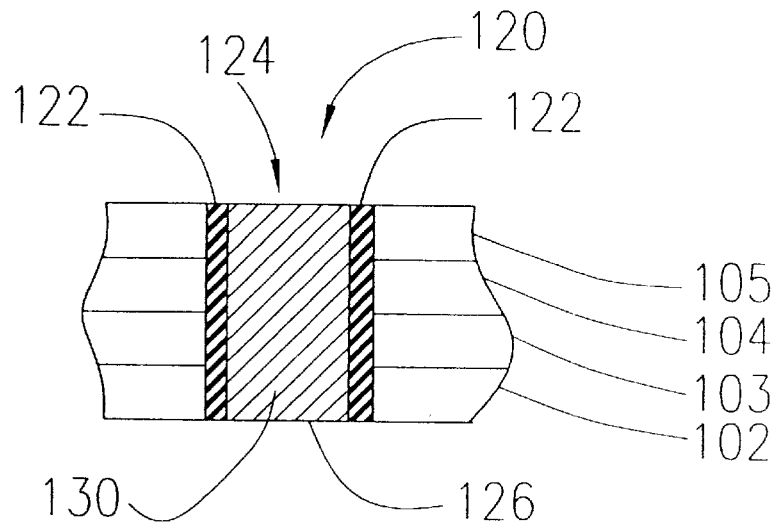
FIG. 6 is a cross sectional view of the stacked power amplifier module showing a metal filled via passing through the module.
Figure 7:
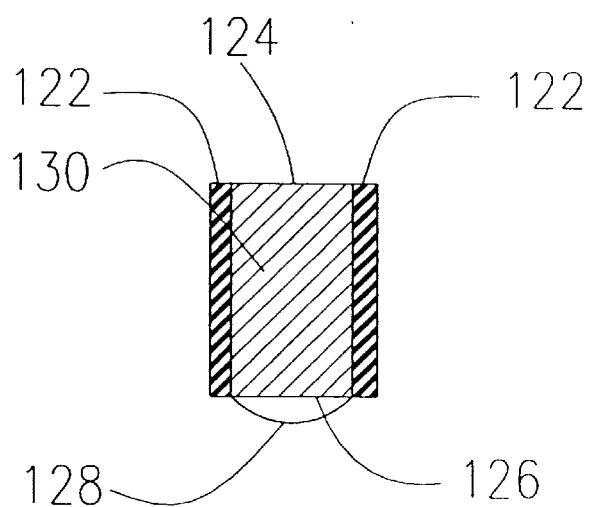
FIG. 7 is a cross sectional view of the metal filled via of FIG. 6 arranged as an input/output connection using a ball grid connection.
Figure 8:
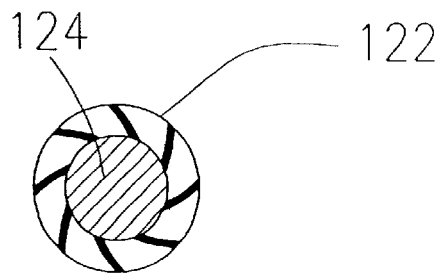
FIG. 8 is a top plan cross sectional view of the metal filled via of FIG. 6.

Metal filled via holes 120, 120 pass generally perpendicularly through the power amplifier module substrate and stacked layers on which the passive components are integrated to conduct input/output signals and power supply voltages to the components of the power amplifier module. The via holes may be formed using any suitable method such as for example, micro machining techniques. FIG. 6 shows a cross sectional view of a metal filled via passing through the module. The metal filled via 120 is surrounded by a dielectric material 122 to insulate it and any electrical signals carried by it from the substrate layers shown for example as 102, 104. The metal filled via 120 is exposed at its upper end 124 to make contact with the components located on the surface 110 of the module 100. The lower end 126 may terminate in a ball grid contact 128 as illustrated in FIG. 7 to make electrical and physical contact with a cooperating electrical contact point. FIG. 8 is a top plan cross sectional view of the metal filled via 120 and shows the dielectric 122 surrounding the metal core 130. As illustrated in FIG. 5, one or more metal filled vias 120 make contact with the active devices 106, 108 to facilitate thermal transfer of heat from the devices and the module in addition to carrying electrical signals and supply voltage potentials.

Figure 9:
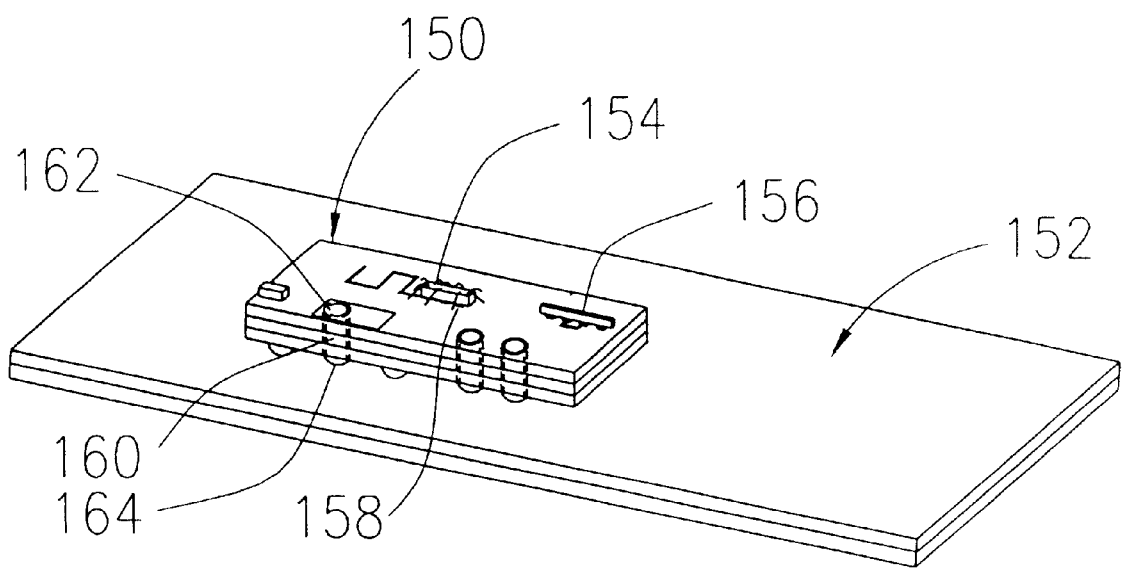
FIG. 9 is a diagrammatic representation of a stacked power amplifier module embodying the present invention shown assembled with a printed circuit board.

FIG. 9 is a schematic representation of a stacked power amplifier module generally designated 150 embodying the present invention connected to a printed circuit board such as a system motherboard generally designated 152 using a ball grid array (BGA) interconnection arrangement. The power amplifier module 150 is similar to the power amplifier module 100 illustrated in FIG. 5. The module 150 includes wire bonded active devices 154 and flip chip devices 156. Metal filled vias 158 interconnect the printed circuit board 152 to the active device 154. Another metal filled via 160 for example, interconnects the printed circuit board 152 to a passive integrated capacitor 162 by means of a ball grid contact 164. A dielectric layer on top of the thin film passive components protects the active devices and covers the passive components except for the electrical contacts. Electromagnetic (EM) shields not shown in the figure may be used to surround the chip(s) and/or the entire amplifier module. In addition to BGA interconnection to the motherboard, LGA (land grid array) interconnection techniques can be employed equally as well with the power amplifier module of the invention.

The power amplifier module of the present invention also uses thin film techniques to coat and pattern magnetic materials such as for example, soft ferrites for manufacturing cores for coils serving as RF chokes. The RF chokes are used as loads for stabilizing voltage power supply feeds to the power amplifier module. The RF chokes are also used when required as isolators at the power amplifier output.

The specific metal for the uppermost substrate of the module is determined by the interconnection and assembly techniques employed for any additional parts, for example, bare die power amplifiers made using Si, GaAs, InP, SiC or some other material, and other component dies, SMT or other components and parts such as EM shields. The partial passive integration approach allows smaller module size due to higher density of thin film integrated passive components and small line width (2–10 $\mu$m) of thin film technology compared to soldered or conductive adhesive mounted discrete passive components and typical module laminate or ceramic substrates and their line width (>10–100 $\mu$m) and typical spacing (>10 $\mu$m).

In a further embodiment of the power amplifier module of the present invention, both the thickness of the active and passive silicon substrates can be reduced to provide a further miniaturized module for stacked systems requiring a thin total system assembly. If the thickness of silicon is ~<80 $\mu$m, the silicon substrate becomes flexible permitting its use directly as a module substrate on the system motherboard thereby further reducing the thermal resistance or temperature coefficient mismatch between the system board and the module board, and which in turn increases system reliability. Stainless steel is also suitable for use as a passive integration material that can be reduced in thickness and which provides good thermal conductivity and flexibility. Both silicon and stainless steel substrates made sufficiently thin to be flexible, can also act as matching media between possible different temperature coefficients of the system board and the power amplifier module. Such thin substrates have acceptable reliability in bending and twisting conditions of the system board without any additional relaxation media such as fill material needed to be placed under the substrate during the system board manufacturing.

What is claimed is:

1. A power amplification module comprising:
   at least one thin film passive integrated substrate having formed therein one or more passive components;
   at least one active element for amplifying electrical signals;
   means for mounting said at least one active element on a surface of said at least one thin film passive integrated substrate;
   means for interconnecting said at least one active element to said one or more passive components formed in said at least one thin film passive integrated substrate thereby defining a power amplification electrical circuit configuration;
   means for connecting input/output electrical signals to and from said integrated passive components and said active elements;
   said connecting means further comprising heat sinking means for transferring heat generated by said active-element away from said active element and said module for dissipation.

2. A power amplification module as defined in claim 1, wherein said thin film passive integrated substrate comprises a flexible silicon substrate.

3. A power amplification module as defined in claim 1, wherein said thin film passive integrated substrate comprises a flexible stainless steel substrate.

4. A power amplification module as defined in claim 1, wherein said interconnecting means further comprises metal filled via holes through said at least one thin film passive integrated substrate.

5. A power amplification module as defined in claim 1, wherein said at least one active element comprises an active die.

6. A power amplification module as defined in claim 4 wherein said metal filled via holes include a dielectric material for electrically insulating said metal in said via from said substrates.

* * * * *

UNITED STATES PATENT AND TRADEMARK OFFICE
CERTIFICATE OF CORRECTION

PATENT NO.   : 6,462,950 B1
DATED        : October 8, 2002
INVENTOR(S)  : Pohjonen It is certified that error appears in the above-identified patent and that said Letters Patent is hereby corrected as shown below:

<u>Column 1,</u>
Line 10, "beat" should be -- heat --.

Signed and Sealed this

Twenty-fifth Day of February, 2003

JAMES E. ROGAN
*Director of the United States Patent and Trademark Office*